(12) United States Patent
Yasaka et al.

(10) Patent No.: US 9,793,085 B2
(45) Date of Patent: Oct. 17, 2017

(54) FOCUSED ION BEAM APPARATUS

(71) Applicant: HITACHI HIGH-TECH SCIENCE CORPORATION, Minato-ku, Tokyo (JP)

(72) Inventors: Anto Yasaka, Tokyo (JP); Tomokazu Kozakai, Tokyo (JP); Osamu Matsuda, Tokyo (JP); Yasuhiko Sugiyama, Tokyo (JP); Kazuo Aita, Tokyo (JP); Fumio Aramaki, Tokyo (JP); Hiroshi Oba, Tokyo (JP)

(73) Assignee: HITACHI HIGH-TECH SCIENCE CORPORATION (JP)

(*) Notice: Subject to any disclaimer, the term of this patent is extended or adjusted under 35 U.S.C. 154(b) by 0 days.

(21) Appl. No.: 15/010,231

(22) Filed: Jan. 29, 2016

(65) Prior Publication Data
US 2016/0225574 A1 Aug. 4, 2016

(30) Foreign Application Priority Data

Feb. 3, 2015 (JP) .................................. 2015-031063

(51) Int. Cl.
*H01J 37/08* (2006.01)
(52) U.S. Cl.
CPC ....... *H01J 37/08* (2013.01); *H01J 2237/0807* (2013.01)
(58) Field of Classification Search
CPC .... H01J 37/08; H01J 2237/0807; H01J 37/02; H01J 37/04
USPC .................. 250/423 R, 424, 423 P, 423 F
See application file for complete search history.

(56) References Cited

U.S. PATENT DOCUMENTS

| 7,431,856 | B2 | 10/2008 | Rezeq et al. ................. 216/58 |
| 2009/0057566 | A1* | 3/2009 | Winkler ............... F25D 19/006 250/423 F |
| 2013/0126731 | A1* | 5/2013 | Shichi .................... H01J 37/08 250/310 |
| 2015/0047079 | A1* | 2/2015 | Kozakai ................ G01Q 60/10 850/26 |
| 2015/0053866 | A1* | 2/2015 | Aramaki ................ H01J 37/08 250/423 R |

FOREIGN PATENT DOCUMENTS

| JP | 2006189276 | 7/2006 |
| JP | 2008239376 | 10/2008 |
| JP | 2009107105 | 5/2009 |

OTHER PUBLICATIONS

Kuo et al., "A single-atom sharp iridium tip as an emitter of gas field ion sources", Jul. 28, 2009, IOP Publishing, Nanotechnology 20 (2009) 335701.*

* cited by examiner

*Primary Examiner* — Nicole Ippolito
(74) *Attorney, Agent, or Firm* — Adams & Wilks

(57) ABSTRACT

A focused ion beam apparatus is equipped with a gas field ion source that can produce a focused ion beam for a long period of time by stably and continuously emitting ions from the gas field ion source having high luminance, along an optical axis of an ion-optical system for a long period of time. The gas field ion source has an emitter for emitting ions, the emitter having a sharpened end part made of iridium fixed to a cylinder-shaped base part made of dissimilar wire.

11 Claims, 16 Drawing Sheets

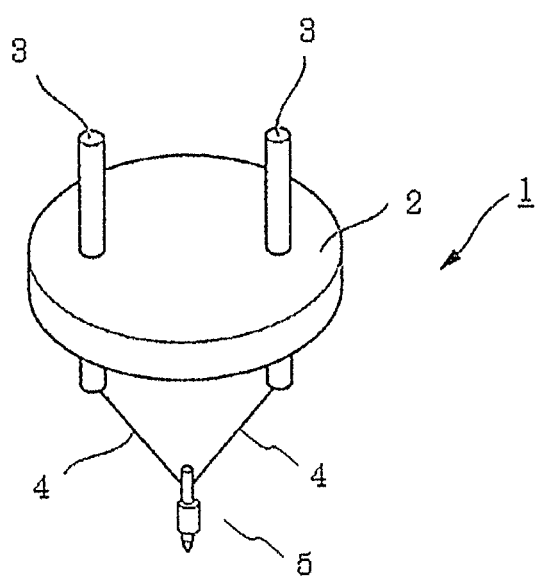
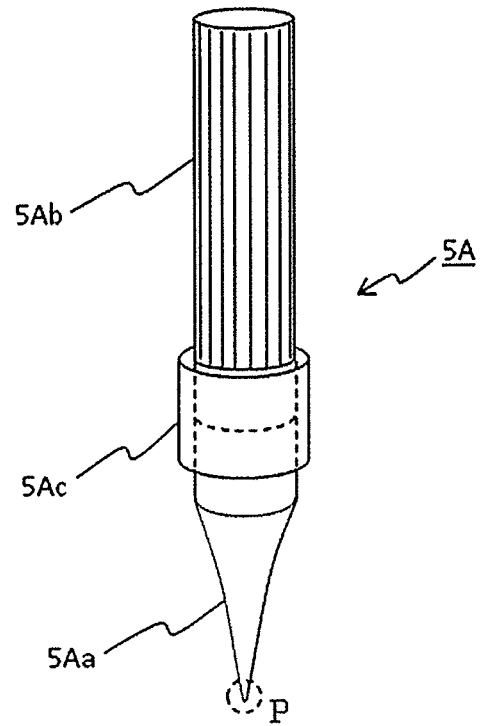
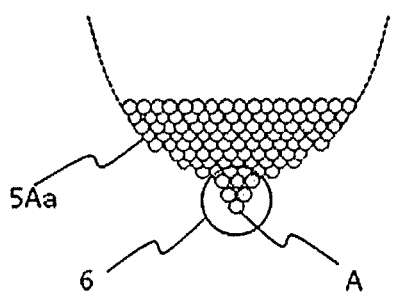
FIG. 1A
FIG. 1B
FIG. 1C

FOCUSED ION BEAM APPARATUS

CROSS REFERENCE TO RELATED APPLICATION(S)

This application claims the benefit of Japanese Patent Application No. JP 2015-031063, filed Feb. 3, 2015, which is hereby incorporated by reference in its entirety into this application.

BACKGROUND OF THE INVENTION

1. Technical Field

The present invention relates to a focused ion beam apparatus equipped with a gas field ion source.

2. Description of the Related Art

A sharpened needle-shaped electrode for generating ions in a gas field ion source (GFIS) of a focused ion beam (FIB) apparatus is called a tip.

In focused ion beam apparatuses equipped with a gas field ion source of the related art, the free end of the tip is sharpened to be composed of several atoms to achieve high resolution.

First, the principle of generating ions by a gas field ion source is described with reference to FIG. 10.

A gas to be ionized is supplied into a gas field ion source chamber and gas molecules or atoms 501 (gas molecules in this case) of helium or hydrogen to be ionized exist around a sharpened tip 500. The tip 500 has been cooled by a cooling unit (not shown).

When power is applied between the tip 500 and an extraction electrode 503 by a power 502 and a high electric field is generated around the free end of the tip 500, the gas molecules 501 around the tip 500 are polarized and attracted to the free end of the tip 500 by polarization force. The attracted gas molecules 501 are ionized by the high electric field at the free end of the tip 500. The ions 504 are emitted to a sample (not shown) through an ion-optical system (not shown) under a hole 503a of the extraction electrode 503.

The size of the area through which beams of the ions 504 (ion beams) are emitted, that is the source size (actual ion emission area) of the gas field ion source is very small, so the gas field ion source becomes a ion source having high luminance and thus it is possible to make very thinly focused ion beams on the sample.

FIGS. 11A to 11C show a schematic shape of the tip 500 of the related art. FIG. 11A shows the entire shape of the tip 500. The tip 500 is formed in a thin and sharpened shape by applying electrolytic polishing (also called wet etching) to the free end of a thin wire having a thickness of hundreds of micrometers or less. FIG. 11B is an enlarged view of the free end P of the tip 500, and as shown in FIG. 11B, the tip 500 has a small projection 505 at the free end. The projection 505, as shown in FIG. 11C, has a schematically pyramidal shape formed by several atomic layers and the apex of the projection 505 is composed of plurality of atoms. Ions 504 of gas molecules are emitted from the position of the outermost atom (at the free end) when a focused ion beam is generated. The projection 505 is referred to as a pyramid structure hereafter.

In the related art, there have been known a gas field ion source using a tungsten tip and an ion microscope (also called a focused ion beam apparatus) equipped with the gas field ion source using a tungsten tip. In general, tips are formed by applying electrolytic polishing to a monocrystal material and it has been known that a facet having low atomic density in a tip surface is easily sharpened. A tungsten tip is sharpened in a direction <111>. A {111} facet of tungsten is triple rotationally symmetric and a {110} or {112} facet becomes a pyramidal side, thereby making a triangular pyramidal structure. The apex is stable when it has a structure composed of three atoms (also called a terpolymer) and ions are emitted from the points of the three atoms.

As a method of sharpening the free end of a tungsten tip with several atoms, there are field-induced gas etching that uses nitrogen or oxygen, thermal faceting, and remolding etc., and the tungsten tip can be effectively sharpened in a <111> orientation.

The tip 500 constitutes a gas field ion source by being attached to a tip assembly. FIG. 12 is a perspective view of a tip assembly 506 of the related art.

The tip assembly 506 includes a pair of electric pins 508 fixed to an insulating base 507, a filament 509 made of a thin wire having a high melting point such as tungsten and disposed between the free ends of the pair of electric pins 508, and a needle-shaped tip 500 mechanically and electrically fixed to the filament 509. The tip 500 is fixedly connected to the filament 509, for example, by spot welding so that current can flow between the electric pins 508, so the filament 509 can be heated to high temperature and the heat can be conducted to the tip 500, thereby heating the tip 500. Ions are emitted from the free end of the tip 500. The needle-shaped tip 500 is made of a thin wire having a circular cross-section electrically and mechanically fixed to the filament 509 and the free end of the tip 500 is sharpened at the atomic level by electrolytic polishing. The tip 500 is made of a monocrystal material such as high-purity tungsten or iridium.

FIG. 13 shows the basic configuration of a gas field ion source 510 of the related art.

The gas field ion source 510 includes an extraction electrode 503, a tip assembly 506, an ion source gas supplier 511, a cooling unit 512, and an extraction power (not shown).

The extraction electrode 503 is spaced from the free end of the tip 500 and has a hole 503a. The extraction electrode 503 guides ions 504 emitted from the tip 500 to an ion-optical system at downstream of the hole 503a.

The extraction power (not shown) can apply extraction power between the extraction electrode 503 and the tip 500, and accordingly, gas molecules 501 are ionized into ions 504 at the free end of the tip 500 and the ions 504 are extracted to the extraction electrode 503.

The ion source gas supplier 511 can supply a small amount of gas (for example, a helium gas) of the gas molecules 501 to be ionized around the tip 500 and is connected to a ion source chamber 513 through a gas supply pipe 511b through which a flow rate can be adjusted by a valve 511a.

The cooling unit 512 cools the tip 500 and the gas molecules 501 supplied to the ion source chamber 513 from the ion source gas supplier 511, using a refrigerant such as liquid helium or liquid nitrogen. A low-temperature refrigerant produced by the cooling unit 512 comes in contact with walls 514 surrounding the tip assembly 506 and the gas supply pipe 511b through a coupling unit 512a, thereby cooling the inside of the ion supply chamber 513 in addition to them.

Next, a process of manufacturing a tip with a small projection at the free end in the related art is described hereafter. In order to manufacture such a tip, electrolytic polishing, field-induced gas etching, thermal faceting, and remolding etc. have been used in the related art.

The field-induced gas etching is a method of etching a tungsten tip by applying a nitrogen gas while observing a FIM (Field Ion Microscope) image through a field ion microscope using helium as an image forming gas. Nitrogen is smaller in field ionization intensity than helium, so nitrogen gas cannot come close to the area where an FIM image is observed (that is, the area where helium is ionized) and is absorbed to a tip side slightly away from the free end of the tungsten tip. Further, the nitrogen gas produces a tungsten nitride by bonding with tungsten atoms on the tip surface. Since field evaporation intensity of the tungsten nitride is small, only a tip side slightly away from the free end where the nitrogen gas is absorbed is selectively etched. However, the tungsten atoms at the free end of the tungsten tip are not etched, so a tip having a free end sharpened further than a tip obtained by electrolytic polishing is obtained (for example, see Patent Document 1).

The thermal faceting is a method of making a polyhedral structure at the free end of a tip by growing predetermined facets by heating a tip, which has undergone electrolytic polishing, under a oxygen atmosphere (for example, see Patent Document 2).

The remolding is a method of making a facet at the free end of a tip by heating and applying high voltage to a tip, which has undergone electrolytic polishing, under ultra-high vacuum (for example, see Patent Document 3).

Further, as a method of making a tip of which the free end is formed of one atom, there is a method of plating a tungsten or molybdenum tip with gold, platinum, palladium, iridium, rhodium, or alloys of them and then applying electrolytic polishing or heating the tip, thereby making a single atom structure (for example, see Patent Document 4).

Further, there is a scanning ion microscope (also called an FIB apparatus) using helium FIB and equipped with a gas field ion source using a tungsten tip (for example, see Non-Patent Document 1).

Further, there is a scanning ion microscopes (also called an FIB apparatus) using helium FIB and equipped with a gas field ion source using a tungsten tip in which the free end of the tungsten tip discharging ions is made of a terpolymer composed of three tungsten atoms (for example, see Non-Patent Document 2).

Further, in order to make a tip made of iridium having higher chemical resistance than tungsten, where the free end of an iridium thin wire has a pyramidal structure composed of one atom, there is a method of applying heat by supplying oxygen into a vacuum container (thermal faceting) (for example, see Patent Document 2).

Further, there is a monocrystal tip made of <210> iridium and having a free end having a small pyramidal structure composed of one {110} facet and two {311} facets (for example, see Non-Patent Document 3).

Further, there is a sharpened monocrystal tip made of <210> iridium and having a free end that has a small pyramidal structure composed of one {110} facet and two {311} facets by thermal faceting and has an apex made of one atom. There is a case that a gas field ion source using this iridium tip has continuously operated for about 2250 seconds (about 37.5 minutes) (for example, see Non-Patent Document 4).

The free end structure of an iridium monocrystal tip of the related art is shown in FIGS. 14A to 15B. FIGS. 14A and 15A are model diagrams of a pyramidal structure when an iridium tip of the related art is seen in a <210> orientation. FIGS. 14B and 15B are schematic diagram simply showing facets. FIGS. 14A and 14B were made with reference to Non-Patent Document 3 and FIGS. 15A and 15B were made with reference to Non-Patent Document 4.

In FIGS. 14A and 15A, an iridium atom 551 on the uppermost surface (outermost surface) of the facets is shown in a white circle and iridium atoms 41 inside under the uppermost surface are shown in gray circles. One iridium atom 551 (552) is positioned at the apex of the pyramid and iridium atoms 551 (553) on the ridges of the pyramid are given black triangles. In FIGS. 14B and 15B, the pyramids each have ridges 555a, 555b, and 555c formed by three conical surfaces 554a, 554b, and 554c and an apex 556 formed by one iridium atom 551 (552).

In FIGS. 14B and 15B, the conical surface 554a is a {110} facet and the conical surfaces 554b and 554c are {311} facets. That is, by using an iridium thin wire, the free end of a <210> iridium monocrystal tip has a pyramidal structure having one {110} facet and two {311} facet, and having one iridium atom at the apex.

The difference of the atomic arrangement of FIG. 14A and FIG. 15A is that the number of the atoms 551 in the bottom of the conical surface 544a is an odd number or an even number, and it is an even number in FIG. 14A and an odd number in FIG. 15A. Depending on whether the number of iridium atoms 551 in the bottoms is an odd number or an even number, the arrangement of iridium atoms 551 in a second layer and the third layer under the iridium atom 551 (552) at the uppermost layer, that is, the apex of the free end becomes different. The second layer in the atomic arrangement shown in FIG. 14A includes three iridium atoms 551 and the second layer in the atomic arrangement shown in FIG. 15A includes six iridium atoms 551. Further, the iridium atom 551 (552) at the apex of the pyramidal structure shown in FIG. 15A is positioned at the intersection of three ridges 555a, 555b, and 555c. On the contrary, the iridium atom 551 (552) at the apex of the pyramidal structure shown in FIG. 14A is at a position slightly protruding from the intersection of three ridges 555a, 555b, and 555c.

PRIOR ART DOCUMENT

Patent Document

Patent Document 1: U.S. Pat. No. 7,431,856
Patent Document 2: Japanese Patent Application Publication No. 2009-107105
Patent Document 3: Japanese Patent Application Publication No. 2008-239376
Patent Document 4: Japanese Patent Application Publication No. 2006-189276

Non-Patent Document

Non-Patent Document 1: "Helium Ion Microscope for Semiconductor Device Imaging and Failure Analysis Applications", on pages 249~254 (2008), in conference records of 28th LSI testing symposium (LSITS 2008), by William B. Thompson et al.
Non-Patent Document 2: "Helium ion microscope: A new tool for nanoscale microscopy and metrology", on pages 2871~2874 in the 24th volume (2006) of Journal of Vacuum Science & Technology, by B. W. Ward et al.
Non-Patent Document 3: "Atomic structure of O/IR (210) nanofacets", on pages 89~97 in 596th volume of Surf. Sci. (2005), by Ivan Ermanoski et al.

Non-Patent Document 4: "A Single-atom sharp iridium tip as an emitter of gas field ion sources", 335701 issue in 20th volume of Nanotechnology (2009), by Hong-Shi Kuo et al.

SUMMARY OF THE INVENTION

An object of the present invention is to provide a focused ion beam apparatus in which a gas field ion source has high luminance, ions are emitted along an optical axis, and the current of the emitted ion beams is stable, which is described hereafter.

(1) Luminance of gas field ion source:

A gas field ion source has been known as being higher in luminance than a liquid metal ion source used an FIB apparatus. As luminance is increased, an image with higher resolution is achieved. Accordingly, in order to achieve an image with higher resolution, it is required to further increase the luminance of the gas field ion source.

In order to increase the luminance of a gas field ion source, it is a way of concentrating an ion generation area on a small area, and recently, an ion generation area is decreased by forming a small projection at an atomic level at the free end of a tungsten tip having a sharpened needle shape.

Further, the free end of a tip (ion emission portion) may be composed of three tungsten atoms. In this case, a tungsten tip used for a gas field ion source has a small projection having a substantially triangular pyramidal shape with three atomic apexes called a terpolymer (also called a trimer), in which three beams are simultaneously emitted from the three atoms. An FIB apparatus having the gas field ion source selectively focuses one of three beams emitted from the tungsten tip through a diaphragm in an ion beam path to a sample.

Accordingly, the current of the beam reaching the sample reduces to ⅓ of the entire beam current in simple calculation. Even if the entire current of ion beams emitted from the free end of the tip (the sum of the current of three emitted ions) is uniform, the balance of the current of the ions emitted from the three atoms cannot be concluded as being always stable, that is, a selected beam current may be changed. A change in beam current deteriorates image quality in a process of imaging or damages a machining shape in a process of machining. Accordingly, an observed image or a machined shape may be unstable when a tungsten tip having three atoms at the free end is used.

Further, when a tungsten free end is heated in a vacuum ion chamber, gas remaining in the vacuum chamber, particularly, oxygen or nitrogen is easily attached to the tungsten tip. The oxygen or nitrogen attached to the tungsten tip causes a chemical reaction, so a tungsten oxide or nitride having a low field evaporation intensity is produced. The oxide or the nitride may damage the free end of the tip through field evaporation from the tungsten tip at low field intensity. That is, the tungsten tip has low chemical resistance.

A small amount of oxygen or nitrogen is used for sharpening a tungsten tip, so an oxide or a nitride is necessarily produced on the tungsten tip, and when the free end of the tungsten tip is damaged, the current of produced ions may change or ion emission may be stopped.

Further, when the free end of a tungsten tip is damaged, there is a need for a sharpening process, so down-time (stop time) of an apparatus equipped with the tungsten tip increases. In order to solve these problems, helium ions are emitted from a gas field ion source with a tungsten tip, but in order to supply a helium gas into an ion chamber, an expensive helium gas having the highest purity is required, so the cost for operating a focused ion beam apparatus increases.

Further, it is required to use one atom for an ion emission area at the free of a tip in order to increase the luminance of a gas field ion source.

In order to solve the problem that three atoms make apexes of the free end of a tungsten tip and chemical resistant is low, one atom can make an apex and iridium higher in chemical resistance than tungsten can be used. (Non-Patent Documents 3 and 4)

However, it was found by the inventor(s) that it was difficult to form a desired shape at a desired position, that is, form a pyramidal structure that has an apex composed of one atom and is stably maintained for a long period of time in the process of finishing for sharpening the free end of an iridium tip, only by using the methods of the related art.

Iridium can be easily sharpened because surface atom density in a {210} facet is low, so an iridium tip is sharpened in the <210> orientation. As shown in FIG. 16 showing a plan view of a {210} facet of iridium, the crystals make mirror symmetry to a plane including <110> axis and a <210> axis, so when nitrogen etching is applied, the portions close to the interface between the {210} facet and the {310} facet remain, but each {310} facet makes a rectangle, and thus an odd number of atoms does not remain. That is, it is difficult to retain a small number of atoms at the termination in iridium, including a trimer. Further, when sharpening is finished only with field evaporation, some atom layers at the free end make field evaporation at a time in a lump in many cases, so it is difficult to make a desired apex at the free end.

(2) Stability of emitted ion:

As described above, since a tungsten tip has three atoms at apexes of a small projection at the free end, the current of beams reaching to a sample to be examined may be reduced and the beams may be changed.

FIGS. 17A and 17B are diagrams schematically showing atomic arrangements when two conical surfaces 554a ({110} facet) and 554b and 554c ({310} facet) are seen from the front (that is, in the normal direction) in the pyramidal structures of the iridium tips shown in FIGS. 14A and 15A. In FIGS. 17A and 17B, the iridium atoms 557 in the uppermost surface (outermost surface) are indicated by white circles, the iridium atoms 558 in the second surface right under the uppermost surface are indicated by gray circles, and the others are not given reference numbers.

As can be seen from FIGS. 17A and 17B, in the pyramidal structure of the iridium tip, the gap between the iridium atoms 557 in the uppermost surface is large. Accordingly, other kinds of atoms or other substances remaining in an ion chamber can be easily caught in between the iridium atoms 557. In a gas field ion source using an iridium tip, if other kinds of atoms are caught in the pyramidal structure of iridium, the field distribution around the pyramidal structure breaks, current of ion beams changes, noise is generated, an image is distorted, the radiation positions of ion beams change, or the diameters of ion beams change.

It is difficult to remove other kinds of atoms caught in between the iridium atoms in the uppermost surface, so when current of ion beams changes or an image is distorted, it is required to stabilize ion emission by removing the pyramidal structure of the iridium tip using a high field and then make a new pyramidal structure, so it is troublesome and takes time, and thus continuous observation and processing are difficult.

As described above, when the conventional iridium tip having one atom at the apex is used in a gas field ion source of an FIB apparatus, the atoms or molecules of contaminants remaining in the apparatus can easily stick to the pyramidal structure at the free end of the iridium tip. Accordingly, the current of ion beams emitted from the ion source becomes unstable and a desired observed image cannot be obtained.

Further, in the conventional iridium tip having one atom at the apex, the atom at the apex is easily separated after a short time, so even if the structure having one atom at the apex can be achieved by heating etc., the atom at the apex may be separated with the iridium tip attached to the gas field ion source of an FIB apparatus. In this case, it is required to stop observing and analyzing with the FIB apparatus and remake the iridium tip to have one atom at the apex, so it is required to adjust beams before and after the remaking, and accordingly, undesirable matters are generated in terms of the actual use of a focused ion beam apparatus, which were found through tests by the inventor(s).

As described above, since an iridium tip has high chemical resistance in comparison to a tungsten tip of the related art, damage to the free end due to a remaining gas is suppressed and the apex of the pyramidal structure at the free end of the iridium tip can be made with one atom. However, according to the pyramidal structure of an iridium tip of the related art, contaminants can stick due to the $\{110\}$ and $\{311\}$ facets of the pyramidal structure, and in terms of the actual use, it is difficult to emit ions stably for a long period of time.

(3) Tip assembly structure emitting ions along optical axis:

A tungsten thin wire has high rigidity, so even if a thin wire having a diameter of about 0.1 mm is slightly plastically deformed but maintains straightness when being used for manufacturing a tip or a tip assembly, it is suitable as a tip material. On the other hand, a high-purity iridium thin wire is considerably flexible, as compared with the tungsten thin wire, so when it is used for manufacturing a tip or a tip assembly, the tip is easily bent, so the tip can be easily plastically deformed even by a very weak contact. Accordingly, the free end of the tip can easily come out of the optical axis where it is supposed to be positioned, so emitted ions do not pass through a desired optical axis, and accordingly, a critical problem is generated in that the ability of focusing an FIB is decreased or an FIB does not reach a sample.

In general, it has been well known that an ion source is equipped with a fine adjusting device that can move at an angle in a plane perpendicular to an optical axis to guide ions from the free end of a tip to the optical axis. However, the degree of bending when a tip or a tip assembly is manufactured is too large to be adjusted by the fine adjusting device, so basically, it is the matter to make an iridium tip in a shape that is not easily deformed when manufacturing a tip or a tip assembly.

In consideration of these problems, an object of the present invention is to provide a focused ion beam apparatus that is equipped with a gas field ion source having high luminance, can continuously and stably emit ions from the gas field ion source along an optical axis of an ion-optical system for a long period of time, and can keep focused ion beams for a long period of time.

In order to solve the problems and achieve relevant objects, the present invention employs the following configurations.

(1) There is provided a focused ion beam apparatus equipped with a gas field ion source having an emitter for emitting ions, wherein the emitter has a shape in which sharpened iridium is fixed to dissimilar metal wire.

(2) In the focused ion beam apparatus described in (1), the dissimilar metal wire is made of any one of tungsten, molybdenum, tantalum, and niobium.

(3) In the focused ion beam apparatus described in any one of (1) and (2), the emitter has a pyramidal structure of which an apex is composed of one iridium atom in a <210> orientation surrounded by one $\{100\}$ facet and two $\{111\}$ facets, at a sharpened free end.

According to the present invention, it is possible to provide a focused ion beam apparatus equipped with a gas field ion source that can produce a focused ion beam for a long period of time by stably and continuously emitting ions from the gas field ion source having high luminance, along an optical axis of an ion-optical system for a long period of time.

BRIEF DESCRIPTION OF THE DRAWINGS

The above and other objects, features and advantages of the present invention will be more clearly understood from the following detailed description taken in conjunction with the accompanying drawings, in which:

FIGS. 1A to 1C are views illustrating a tip of a gas field ion source in a focused ion beam apparatus according to the present invention, where, FIG. 1A is a perspective view of a tip assembly equipped with a tip according to an embodiment, FIG. 1B is a view illustrating a tip shape according to a embodiment, and FIG. 1C is a view illustrating the free end of an iridium tip.

FIG. 6A is a model diagram of atoms in a pyramidal structure and FIG. 6B is a view illustrating facets;

FIG. 7A is a view of a $\{100\}$ facet making a conical surface when seen from the front and FIG. 7B is a view of a $\{111\}$ facet making a conical surface when seen from the front;

FIG. 11A is a perspective view of the tip, FIG. 11B is an enlarged view of a free end portion P of the tip shown in FIG. 11A, and FIG. 11C is an enlarged view of the free end of the tip shown in FIG. 11A;

FIG. 14A is a model diagram of atoms in a pyramidal structure and FIG. 14B is a view illustrating facets;

FIG. 15A is a model diagram of atoms in a pyramidal structure and FIG. 15B is a view illustrating facets;

FIG. 17A is a view of a {110} facet making a conical surface when seen from the front and FIG. 17B is a view of a {311} facet making a conical surface when seen from the front.

DESCRIPTION OF THE PREFERRED EMBODIMENTS

Figure 2:
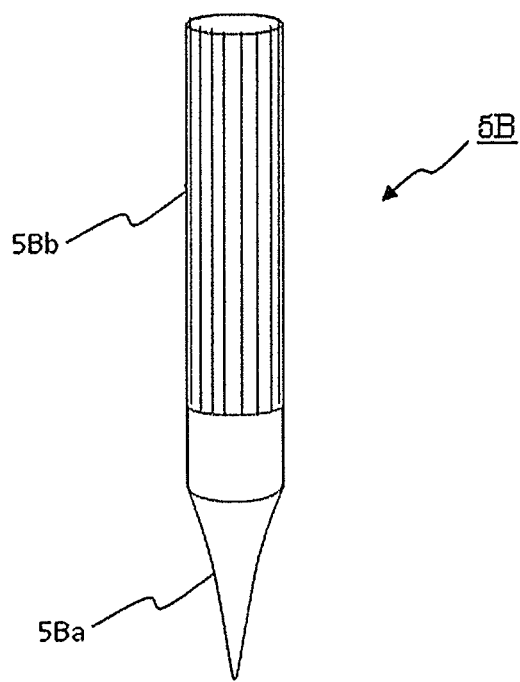
FIG. 2 is a view illustrating another shape of a tip according to the present invention.

The present invention will be described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

A tip structure according to an embodiment of the present invention, a method of manufacturing an iridium tip, a gas field ion source having the tip, and a focused ion beam apparatus equipped with a gas field ion source will be described hereafter with reference to the accompanying drawings.

(Embodiment 1) Tip Structure

Characteristics of a gas field ion source of a focused ion beam apparatus according to the present invention will be described hereafter in parts in accordance with (1) tip material, (2) tip shape, (3) pyramidal structure of free end of tip, and (4) apex of pyramidal structure.

(1) Tip Material:

A tip material used in the present invention is monocrystal iridium.

As described above, when a nitrogen gas or an oxygen gas that is chemically active is supplied into a gas field ion source having a tungsten tip to emit nitrogen ions or oxygen ions, the gases make a chemical reaction at the free end of the tungsten tip, so desired atomic distribution cannot be achieved around the free end. Further, it causes undesirable problems such as a change in ion emission, reduction of ion current, and deterioration of the ability of focusing ions, and in the worst case, stopping of ion emission. Therefore, iridium having high chemical resistance, as compared with tungsten, is used for the tip material.

(2) Tip Shape:

As described above, since a thin wire made of high-purity iridium is easily plastically deformed, the following shapes are used in the focused ion beam apparatus of the present invention to make sure that ions can pass an ion-optical axis. The plastic deformation of an iridium thin wire means not deformation at the conical part at a free end, but deformation at a cylindrical part of a thin wire. Plastic deformation of the conical part is determined as a defective product and it is not mounted on a gas field ion source.

(A) First Shape

FIGS. 1A to 1C show an example of a tip shape according to the present invention, where FIG. 1A shows the entire shape of a tip assembly 1 that includes a pair of electric pins 3 fixed to an insulating base 2, a filament 4 made of a wire having a high melting point such as tungsten and disposed between the ends of the pair of electric pins 3, and a needle-shaped tip 5 mechanically and electrically fixed to the filament 4.

FIG. 1B is an enlarged view of the first shape of the tip 5 according to the present invention. The tip 5A has an end part 5Aa and a base part 5Ab, which have the same diameter, and the base part 5Ab is coupled to the filament by spot welding. The end part 5Aa is made of iridium and the base part 5Ab is a wire rod made of a material having a high melting point and elasticity such as tungsten. In order to make sure of coupling the end part 5Aa and the base part 5Ab and ensuring coaxial arrangement, the joint is covered with a thick cylinder or ring 5Ac having an inner diameter slightly larger than the diameter of the end part 5Aa and the base part 5Ab and the cylinder 5Ac is pressed. The cylinder 5Ac is, for example, made of tungsten. Heat that heats the filament is conducted through the base part 5Ab and the cylinder 5Ac, so the end part 5Aa is heated. The end part 5Aa is electrically and mechanically coupled to the base part 5Ab and then sharpened by a process such as electrolytic polishing. The tip 5A may be fixed to the filament after being sharpened, or may be pointed after a tip material is fixed to the filament.

FIG. 1C is an enlarged view of the free end portion P of the tip 5A. In this figure, circles indicate iridium atoms and the end part 5Aa has a pyramidal structure 6 having one atom A at the apex. The heat that heats the filament by the electricity applied to the electric pins 3 can heat even the free end of the end portion 5Aa through the base part 5Ab and the cylinder 5Ac, so the pyramidal structure can be achieved.

According to the first shape of a tip, the end part 5Aa made of iridium is short and is not easily deformed.

(B) Second Shape

FIG. 2 shows a second shape of a tip for a gas field ion source according to the present invention. A tip 5B has an end part 5Ba and a base part 5Bb, and the end part 5Ba and the base part 5Bb are mechanically and coaxially fixed by spot welding. The end part 5Ba is made of iridium and the base part 5Bb is made of a material having a high melting point and elasticity such as tungsten. The end part 5Ba is a rod not sharpened yet when it is fixed to the base part 5Bb, but is sharpened by electrolytic polishing after being fixed. According to this shape, the end part made of iridium is short, so it is difficult to deform.

(C) Third Shape

Figure 3:
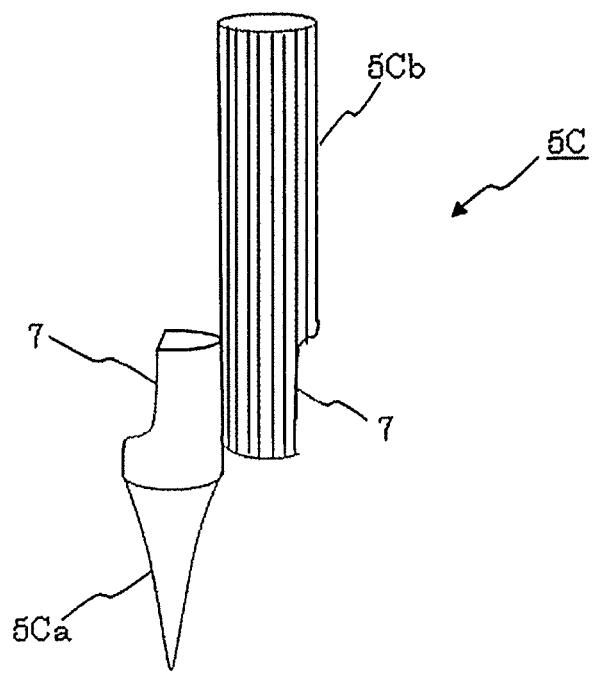
FIG. 3 is a view illustrating another shape of a tip according to the present invention.

FIG. 3 shows a third shape of a tip for a gas field ion source according to the present invention. A tip 5C also has an end part 5Ca and a base part 5Cb, but they are not coaxially coupled, but are electrically and mechanically coupled and pressed by performing spot welding in a direction perpendicular to the axes of the end part 5Ca and the base part 5Cb. The tip 5C has recesses 7 formed by spot welding and pressing. The end part 5Ca and the base part 5Cb are not coaxially coupled but the distance between their axes is substantially the same as the diameter of the tip material, so the end part 5Ca and the center of an opening of an extraction electrode can be aligned.

Even in this shape, the end part 5Ca is a rod not sharpened yet when it is fixed to the base part 5Cb, but is sharpened by the following method such as electrolytic polishing after being fixed. According to this shape, the end part 5Ca made of iridium is short, so it is difficult to deform.

(D) Fourth Shape

Figure 4:
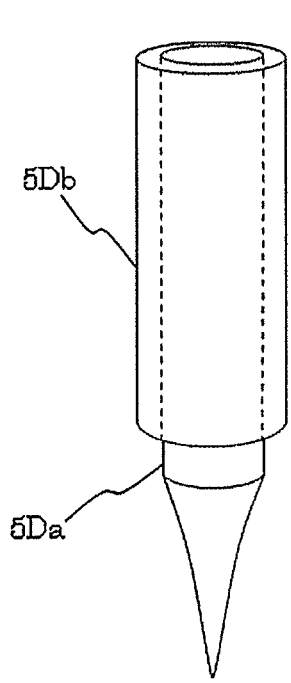
FIG. 4 is a view illustrating another shape of a tip according to the present invention.

FIG. 4 shows a fourth shape of a tip for a gas field ion source according to the present invention. A tip 5D has a core part 5Da and a cylindrical part 5Db, in which the inner diameter of the cylindrical part 5Db is slightly larger than the outer diameter of the core part 5Da, and the core part 5Da is inserted in the cylindrical part 5Db and then they are pressed. The core portion 5Da is an iridium thin wire and the cylindrical part 5Db is made of a material having a high melting point such as tungsten. The free end of the core part 5Da is slightly exposed from the cylindrical part 5Db, so the core part 5Da made of iridium is kept straight when it is fixed to a filament.

(E) Fifth Shape

Figure 5:
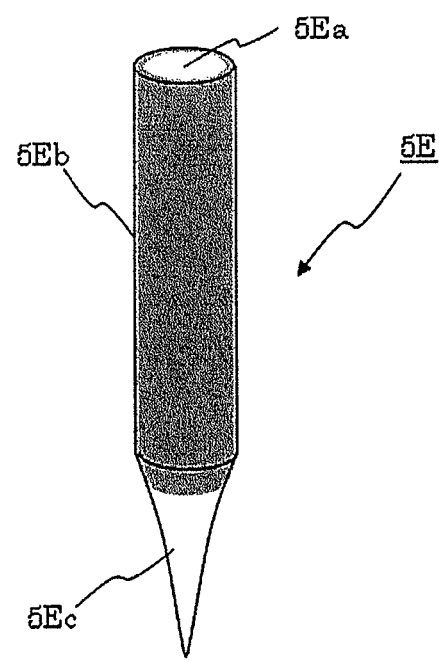
FIG. 5 is a view illustrating another shape of a tip according to the present invention.

FIG. 5 shows a fifth shape of a tip for a gas field ion source according to the present invention. Impurities are ion-implanted in the surface of an iridium thin wire 5Ea of a tip 5E. The ions that are implanted are gas ions such as oxygen, nitrogen, and carbon, and one or a plurality of kinds of ions can be implanted. A tip material can be hardened by implanting the ions into an indium tip material that is not sharpened yet. That is, although a thin wire made of high-purity iridium is easy to plastically deform, it is hardened by implanting such elements in a surface, so it becomes difficult to plastically deform.

An ion implantation layer formed on a surface of a tip material by ion implantation depends of the kinds of ions, ion acceleration energy, and ion-incident angle, but the difference is at most about 1 μm and a cylindrical tip material has a diameter at a level of 100 μm, so ions are implanted only in the surface of the tip material. Accordingly, even if a tip material is sharpened by electrolytic polishing, crystallinity to the center of a thin wire where a pyramidal structure is formed is not deteriorated, so a pyramidal structure can be formed at the free end of the hardened iridium thin wire.

The ion implantation is performed by an ion implantation device (not shown) well known in the art and an ion implantation layer is formed through the whole sides of the iridium thin wire, so it is possible to place a iridium thin wire such that the iridium thin wire can rotate perpendicular to the radiation direction of implanted ions and then to implant ions and simultaneously rotate the iridium thin wire. Further, it is possible to efficiently achieve a hardened iridium thin wire by placing a plurality of thin wires such that they can simultaneously rotate.

(F) Sixth Shape

A sixth shape of a tip for a gas field ion source according to the present invention is described.

As described above, a thin wire made of high-purity monocrystal iridium is easier to plastically deform (bend) than a tungsten thin wire. However, when a small amount of impurities are included when high-purity monocrystal iridium is manufactured, an iridium thin wire increases in elastic property after the manufacturing, so it can maintain the original shape without plastically deforming even by a small contact with a tip material.

Impurities that are included in high-purity iridium are, for example, platinum metal (ruthenium (Ru), rhodium (Rh), palladium (Pd), osmium (Os), and platinum (Pt)) and at least any one of these components is included from 0.05 atom % to 5 atom %. At least any one of ruthenium and rhodium may be included from 0.05 atom % to 5 atom %. When a plurality of impurities is included, the sum of the content by percent of all the impurities is maintained from 0.05 atom % to 0.5 atom %.

When the content by percent of the impurities is less than 0.05 atom %, an iridium tip material is not given elasticity, but when the content by percent of the impurities is over 5 atom %, crystallinity at the free end of the iridium tip material is deteriorated or it is difficult to maintain one iridium atom at the free end of an iridium pyramidal structure, so 5 atom % or less is preferable.

Since a small amount of impurities are included in high-purity iridium, as described above, an iridium tip can be given elasticity and the tip is difficult to plastically deform, so the free end of the tip can be easily set as an optical axis of an ion beam-optical system.

Further, the iridium tips having the fifth and sixth shapes may have the end parts 5Aa, 5Ba, and 5Ca and the core part 5Da of the first to fourth shapes.

Although the materials of the base part 5Ab, 5Bb, and 5Cb of the first to fourth shapes and the cylindrical parts 5Ac and 5Db of the first and fourth shapes are tungsten in the above description, the materials are not limited thereto and molybdenum (Mo), tantalum (Ta), and niobium (Nb) may be used.

(3) Pyramidal Structure of Free End of Tip:

Further, there is a monocrystal tip made of <210> iridium and having a free end having a small pyramidal structure composed of one {110} facet and two {311} facets (see FIG. 14) in the related art. On the contrary, in a gas field ion source according to the present invention, an iridium tip having a small pyramidal structure composed of a {100} facet and a [111] facet, which is not known yet, is used, so it is different from the structure of the related art.

An iridium crystal is a face-centered cubic structure and iridium atoms are positioned at eight corners and at the centers of six sides of a unit cube.

Figure 6A:
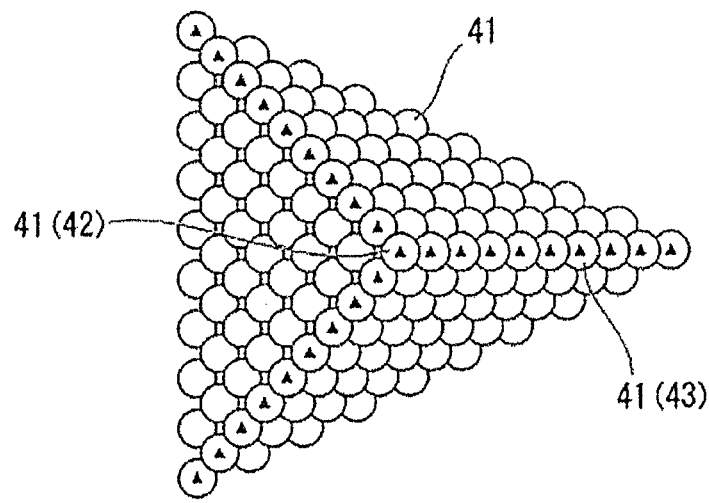
FIGS. 6A and 6B are views illustrating a pyramidal structure at the free end of an iridium tip according to an embodiment of the present invention, where
Figure 6B:
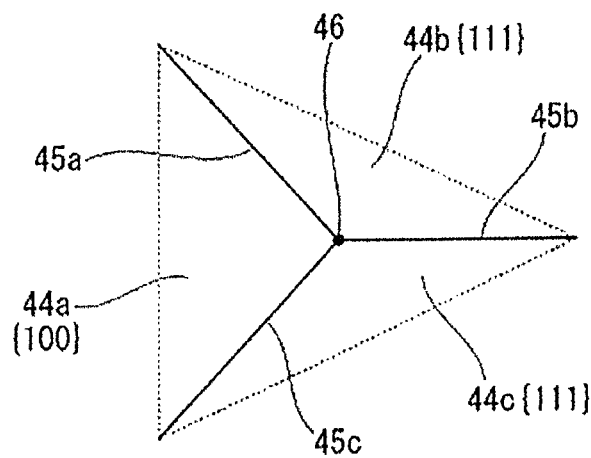

FIGS. 6A and 6B are model diagrams showing a pyramidal structure in a <210> orientation, when the inventor(s) observes an FIM image of a pyramidal structure at the free end of the iridium tip 5 according to an embodiment of the present invention. FIG. 6A shows an atomic arrangement in which one circle corresponds to one iridium atom 41. In this pyramidal structure, one iridium atom 42 makes an apex and the ridges are each composed of a series of iridium atoms 43 indicated by triangles. FIG. 6B is a schematic diagram more simply showing the conical surfaces of the pyramidal structure shown in FIG. 6A, in which the pyramidal structure has conical surfaces 44a, 44b, and 44c and ridges 45a, 45b, and 45c.

Figure 14A:
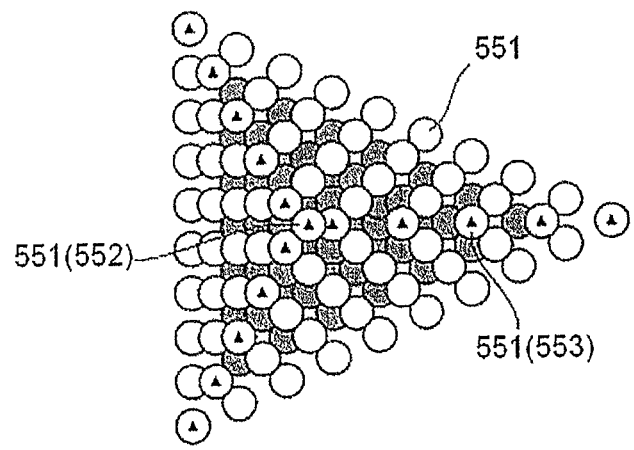
FIGS. 14A and 14B are views illustrating a pyramidal structure at the free end of an iridium tip of the related art, where
Figure 14B:
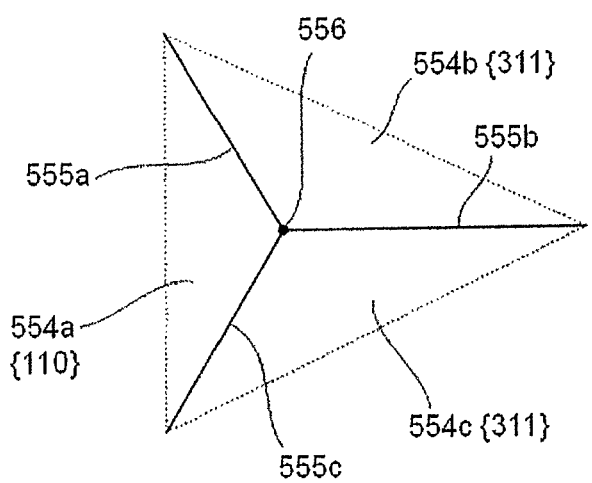
Figure 15A:
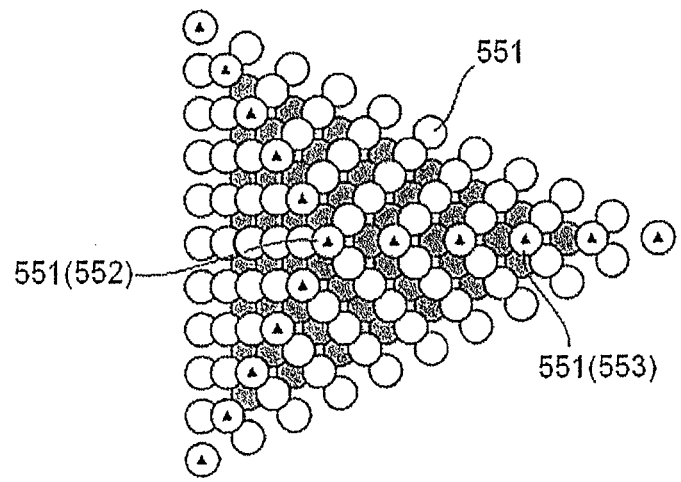
FIGS. 15A and 15B are views illustrating another pyramidal structure at the free end of an iridium tip of the related art, where
Figure 15B:
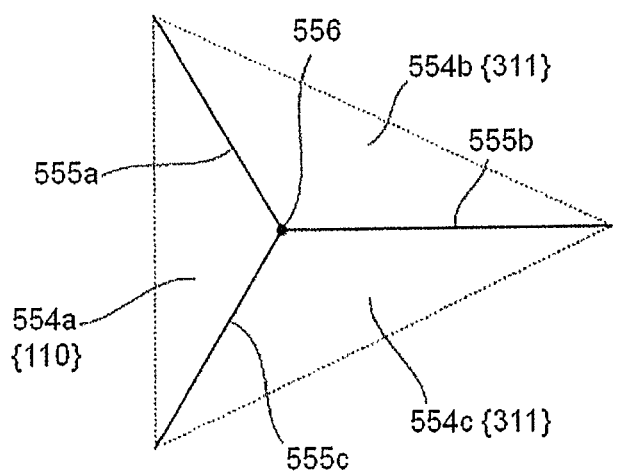
Figure 16:
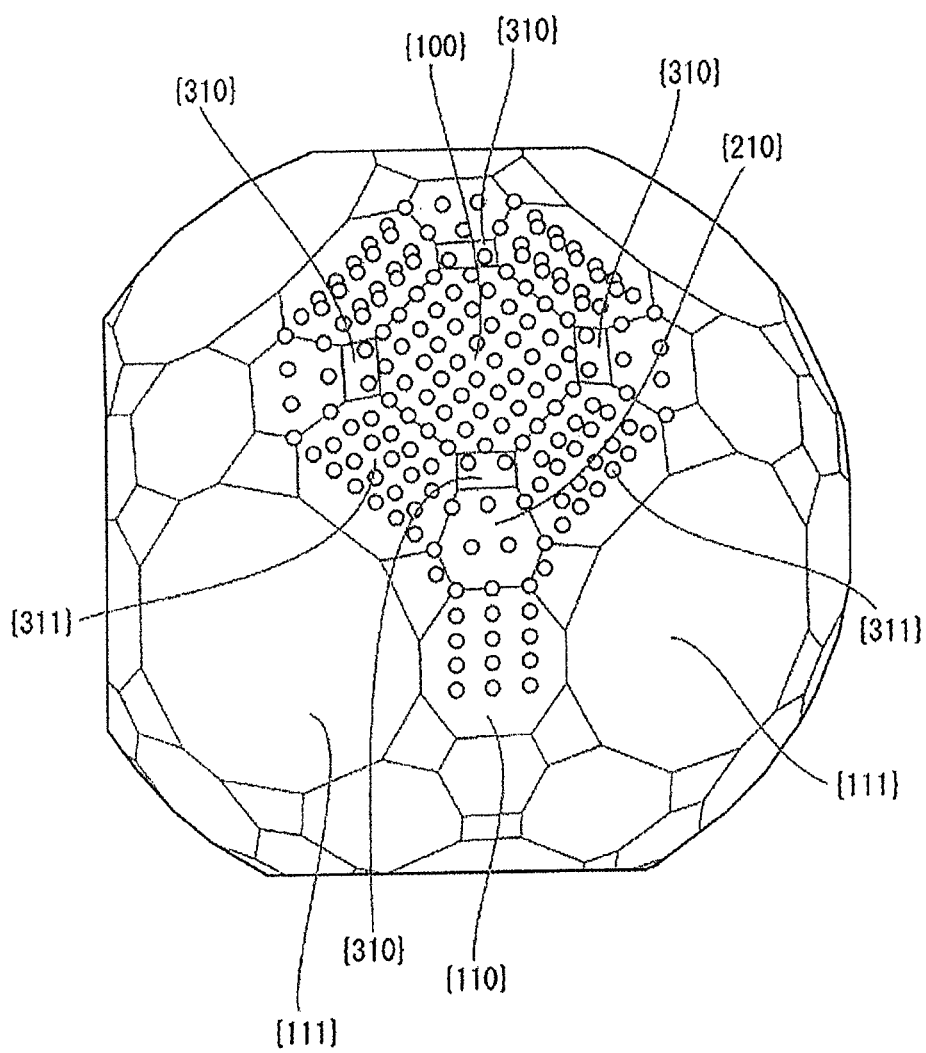
FIG. 16 is a view showing arrangement of facets of iridium.

In the pyramidal structure of the iridium tip 5 according to this embodiment shown in FIG. 6A, the gaps between the iridium atoms 41 and 43 on the ridges 45a, 45b, and 45c are small, as compared with the pyramidal structures of the iridium tips shown in FIGS. 14A and 15A. Accordingly, it can be considered that the slopes of the ridges 45a, 45b, and 45c and the conical surfaces 44a, 44b, and 44c of the pyramidal structure of the iridium tip 5 according to this embodiment are larger than the slopes of the ridges 555a, 555b, and 555c of the related art example, that is, the slopes of the conical surfaces 554a, 554b, and 554c. That is the pyramidal structure of the iridium tip 5 of this embodiment is sharpened farther than the pyramidal structures of the related art examples, so an electric field can be easily concentrated around the pyramidal structure of the free end of the iridium tip 5.

Figure 9:
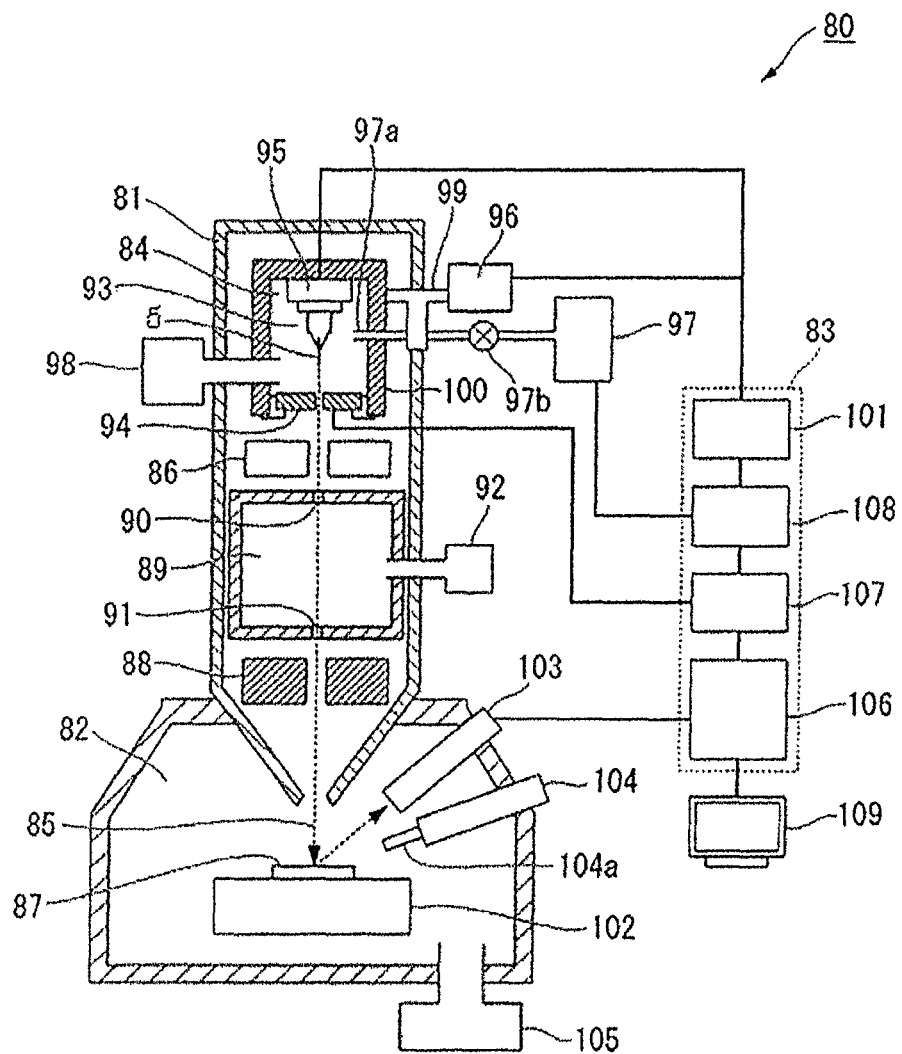
FIG. 9 is a view showing the configuration of a focused ion beam apparatus according to an embodiment of the present invention.
Figure 10:
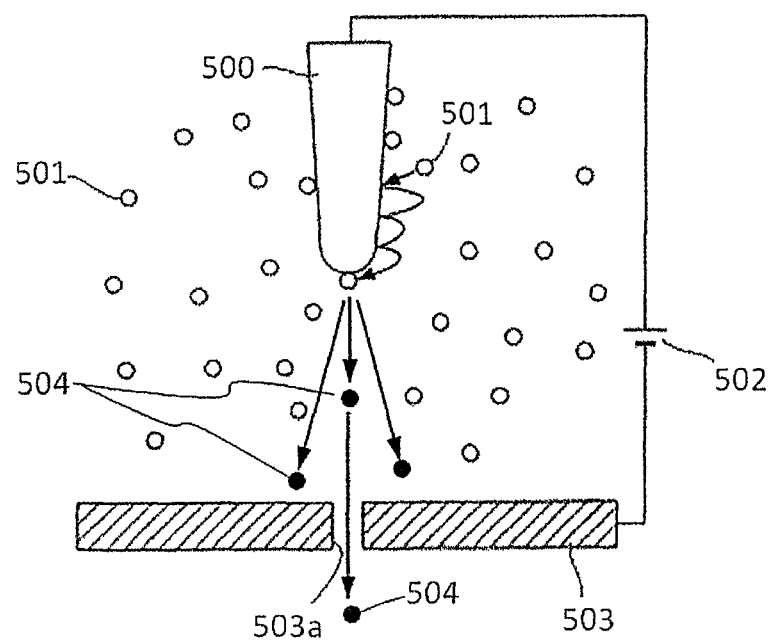
FIG. 10 is a schematic view illustrating ionization in a gas field ion source.
Figure 11A:
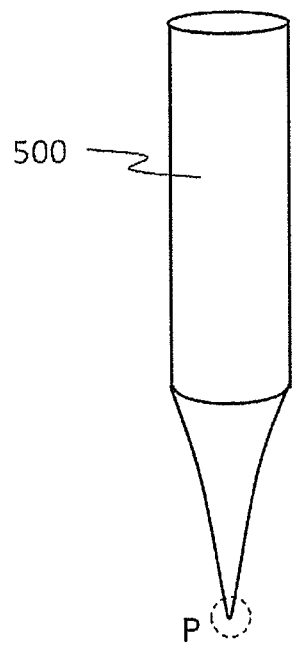
FIGS. 11A to 11C are schematic view illustrating a tip of the related art, where
Figure 11B:
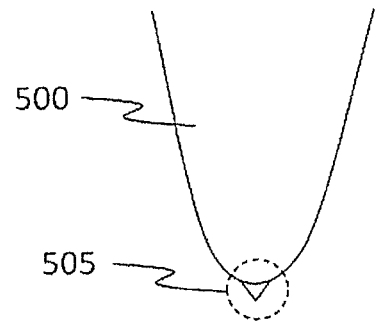
Figure 11C:
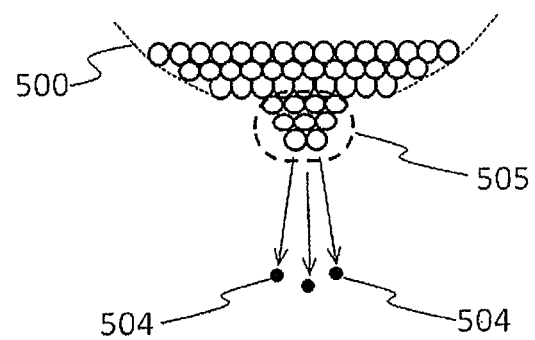
Figure 12:
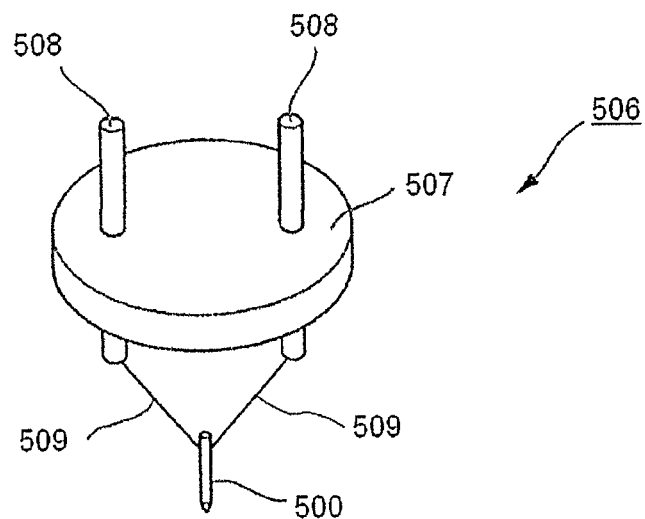
FIG. 12 is a perspective view illustrating a tip assembly of the related art.
Figure 13:
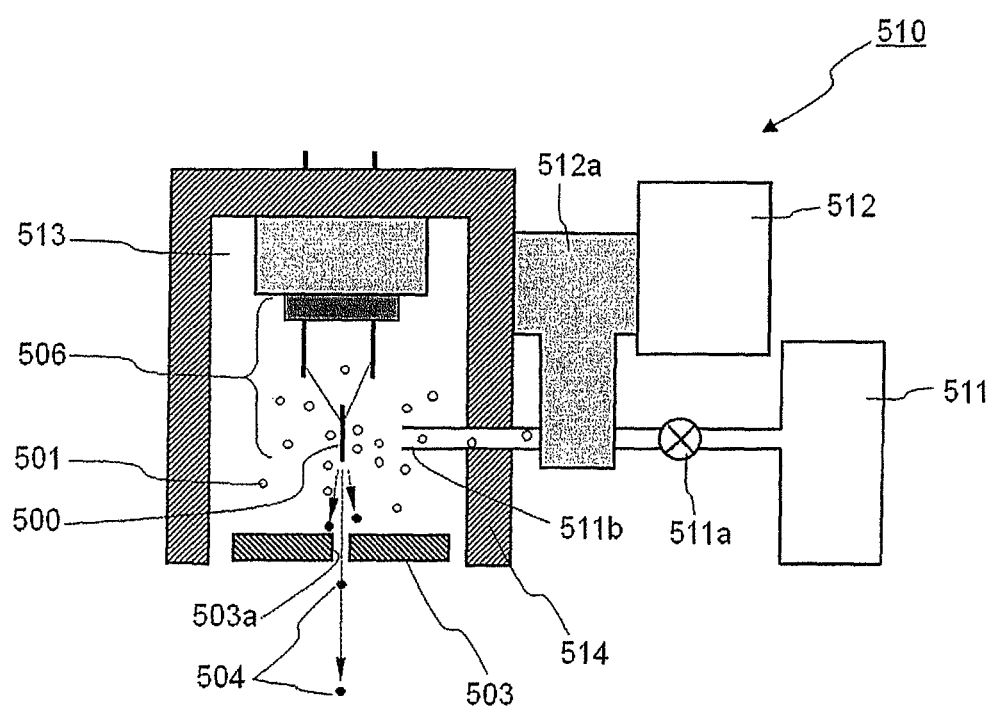
FIG. 13 is a schematic view illustrating the structure of a gas field ion source of the related art.

Accordingly, the iridium tip 5 of this embodiment can emit ions at extraction voltage lower than those of the iridium tips of the related art examples, reduce load on the power (for example, the power 107 in FIG. 9) that applies the extraction voltage, and suppress abnormal discharge between the free end of the iridium tip 5 and the extraction electrode (for example, the extraction electrode 94 in FIG. 9).

The pyramidal structure of the iridium tip 5 of this embodiment is different in order of the facets, as compared with the pyramidal structures of the iridium tips of the related art examples. That is, the {100} facet and the {111} facet of the conical surfaces in the pyramidal structure of the iridium tip 5 of this embodiment have lower orders having high atomic density, as compared with the {110} facet and the {311} facet of the conical surfaces in the pyramidal structures of the iridium tips of the related art examples.

Figure 7A:
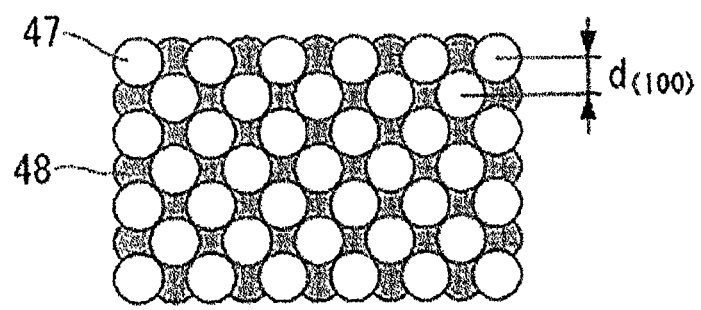
FIGS. 7A and 7B are views showing atomic arrangement in facets of a pyramidal structure at the free end of an iridium tip according to an embodiment of the present invention, where
Figure 7B:
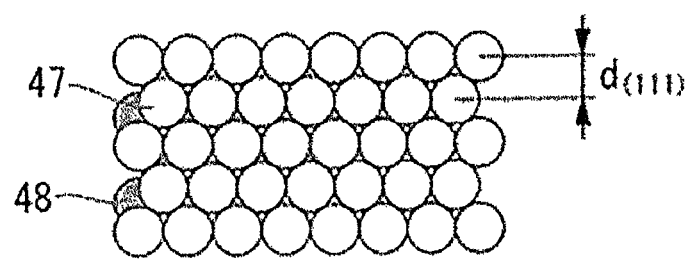

FIGS. 7A and 7B are diagrams schematically showing atomic arrangement of three conical surfaces 44a ({100} facet), 44b and 44c ({111} facets) of the pyramidal structure according to this embodiment when seen from the front (that is, in the normal direction). In FIGS. 7A and 7B, the iridium atoms 47 in the uppermost surface (outermost surface) are indicated by white circles, the iridium atoms 48 in the second surface right under the uppermost surface are indicated by gray circles, and the others are not given reference numbers.

Figure 17A:
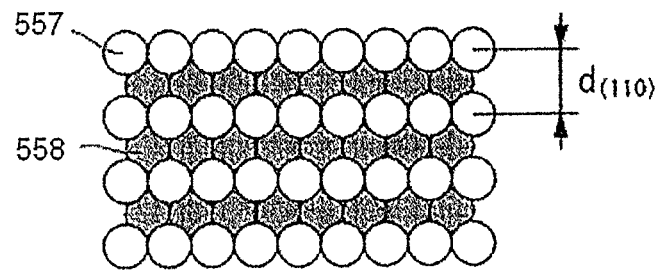
FIGS. 17A and 17B are views showing atomic arrangement in facets of a pyramidal structure at the free end of an iridium tip of the related art, where
Figure 17B:
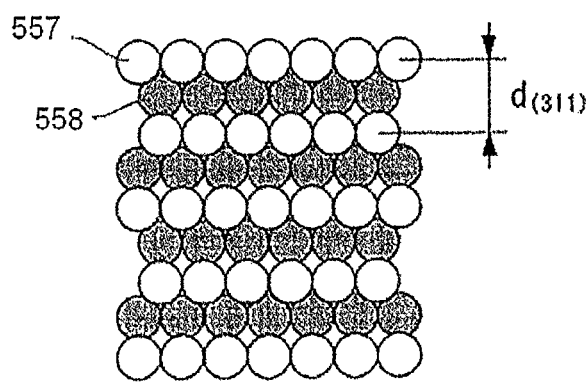

The atomic arrangement in the outermost surface in the pyramidal structure of the iridium tip 5 of this embodiment shown in FIGS. 7A and 7B is visually considered as being dense, as compared with the atomic arrangement in the outermost surface in the pyramidal structure of the iridium structure of the related art shown in FIGS. 17A and 17B.

For example, in a quantitative respect, assuming that a lattice constant is d, the distance $d_{(100)}$ between adjacent atomic rows in the {100} facet of the iridium tip according to this embodiment shown in FIGS. 7A and 7B is 0.5 d and the distance $d_{(111)}$ between adjacent atomic rows in the {111} facet is 0.61 d. However, in the {311} facet and the {110} facet of the iridium tip of the related art shown in FIGS. 17A and 17B, the distance $d_{(311)}$ is 1.17 d and the distance $d_{(110)}$ is 1.00 d. That is, the distance between atomic rows in the conical surfaces of the pyramidal structure of the iridium tip 5 according to this embodiment is smaller than the distance between atomic rows in the conical surfaces of the pyramidal structure of the iridium tip according to the related art.

Further, considering the lattice constant of iridium is 0.3839 nm by the atomic density n in each facet, the density n in the {100} facet is $13.6 \times 10^{18}/m^2$ and the density n in the {111} facet is $15.7 \times 10^{18}/m^2$, whereas the density n in the {110} facet is $9.6 \times 10^{18}/m^2$ and the density n in the {311} facet is $8.2 \times 10^{18}/m^2$. That is, the atomic density in the outermost surface of the pyramidal structure of the iridium tip 5 according to this embodiment is higher than the atomic density in the outermost surface of the pyramidal structure of the iridium tip of the related art, so the gap between atoms in a surface is larger in this embodiment than the related art.

As described above, since the distance between the atomic rows in the outermost surface is large and the atomic density in a surface is small in the pyramidal structure of the iridium tip according to the related art, it is conjectured that, for example, other kinds of atoms or molecules flowing around the tip are likely to be caught in between the iridium atoms. When another kind of atom is caught, it breaks the atomic arrangement of the iridium crystalline at the free end of iridium tip, so it may break the field distribution around the free end of the iridium tip. As a result, the current of the ions emitted from the free end of the iridium tip becomes unstable and it changes the current of ion beams radiated to a sample, so the observed image may be distorted or the processed surface may be unsmooth.

In contrast, in one {110} facet and two {111} facets constituting the conical surfaces of the pyramidal structure of the iridium tip 5 according to this embodiment, the distance between atoms is small in comparison to the related art, so another kind of atom is difficult to be caught in between the iridium atoms and may at most stick (be physically adsorbed) to the facets. Even if another kind of atom sticks to a facet, it is possible to easily remove the atom sticking to the facet by applying a small amount of heat or adjusting an electric field smaller than an field intensity for ionizing nitrogen gas that is supplied to the iridium tip 5, so it is possible to keep the crystal pyramidal structure composed of only iridium atoms. Therefore the current of emitted ions is stably maintained for a long period of time and a change in current of ion beams radiated to a sample is suppressed, so an observed image or a processed surface without distortion can be achieved.

Further, since the distance between the atoms is small in the pyramidal structure of the iridium tip 5 according to this embodiment, the structure is strong against external disturbance such as temperature.

(4) Apex of Pyramidal Structure:

The pyramidal structure at the free end of the iridium tip 5 according to the present invention was described with reference to FIGS. 6A and 6B. In order to compare the pyramidal structure shown in FIGS. 6A and 6B with the pyramidal structures shown in FIGS. 14A to 15B, a pyramidal structure including a first layer including one iridium atom that forms an apex, a second layer including iridium atoms perpendicular to a <210> axis right under the first layer, and a third layer right under the second layer was provided, and the arrangement and the number of iridium atoms from the first to third layers are shown in the following Table 1.

TABLE 1

| Layer | Number of atoms Arrangement and number of iridium atoms | | |
|---|---|---|---|
| | Invention (FIG. 6) | Related art example (FIG. 14A and FIG. 14B) | Related art example (FIG. 15A and FIG. 15B) |
| First layer (Apex) | ● One | ● One | ● One |

TABLE 1-continued

| Layer | Invention (FIG. 6) | | Related art example (FIG. 14A and FIG. 14B) | | Related art example (FIG. 15A and FIG. 15B) | |
|---|---|---|---|---|---|---|
| | Number of atoms | | | | | |
| | Arrangement and number of iridium atoms | | | | | |
| Second layer | ●●● ● | Three | ●● ●● | Three | ●●● ●●● ● | Six |
| Third layer | ●●● ●●● ● | Six | ●● ●●● ●●●● ● | Ten | ●● ●●● ●●●● ●●●●● ● | Fifteen |

According to the pyramidal structure of the present invention, one iridium atom is positioned in the first layer and three iridium atoms are positioned at the apexes, respectively, of an isosceles triangle (for example, an isosceles triangle where when the distance of one side is 1, the other equal sides are substantially 1.22) close to a regular triangle in the second layer. Six iridium atoms are positioned at the apexes and the sides, respectively, of a triangle in the third layer. The numbers of the iridium atoms from the first layer to the third layers are one, three, and six, respectively.

On the other hand, according to the pyramidal structures of the related art, the first layer is the apex of each of the pyramidal structure and includes one iridium atom, which is the same as the present invention, but the second layer and the third layer include three and ten iridium atoms, respectively, in the pyramidal structure shown in FIG. 14A, and six and fifteen iridium atoms, respectively, in the pyramidal structure shown in FIG. 15A. From these configurations, it may be inferred that the second layer or the third layer includes many atoms in the pyramidal structures of the related art, so the pyramidal structures become wider as they go to the end, whereas the pyramidal structure of the present invention is relatively steep, that is, becomes less wider, as it goes to the end.

As described above, the pyramidal structure of the iridium tip 5 of this embodiment and the pyramidal structures of the related art examples are clearly different in the atom arrangement to the third layer. Further, it is possible to know these structures by operating a gas field ion source actually equipped with an iridium tip, separating the atoms in the unit of layer in the pyramidal structures by applying appropriate voltage, and observing the shapes with an FIM. Even if a gas field ion source equipped with an unknown iridium tip is provided, it is possible to find that it is the structure of the present invention or the structures of the related art.

Further, the atom arrangement in the second layer and the third layer can be checked by forcibly separating the iridium atoms 41 in the layers by adjusting an electric field when observing an FIM image, and the inventor(s) has found that the arrangement is the same as that shown in FIG. 6A.

Further, using the iridium tip 5 with the iridium atom 41 (42) at the apex separated as a needle-shaped electrode of an ion source causes reduction of the current of a beam reaching a sample, so it is not preferable. In this case, it was possible to maintain the one atom at the apex by remaking the free end of the tip, which will be described below.

As described above, the iridium tip 5 of this embodiment is further sharpened than the iridium tips of the related art examples, so it can emit ions at lower voltage, is strong against external disturbance, and does not allow impurities to easily stick, so it can emit ions for a long period of time.

(Embodiment 2) Method of Manufacturing Iridium Tip

A method of manufacturing an iridium tip having a pyramidal structure of which the apex is composed of one atom, which was described in the Embodiment 1, is described herein.

Figure 8:
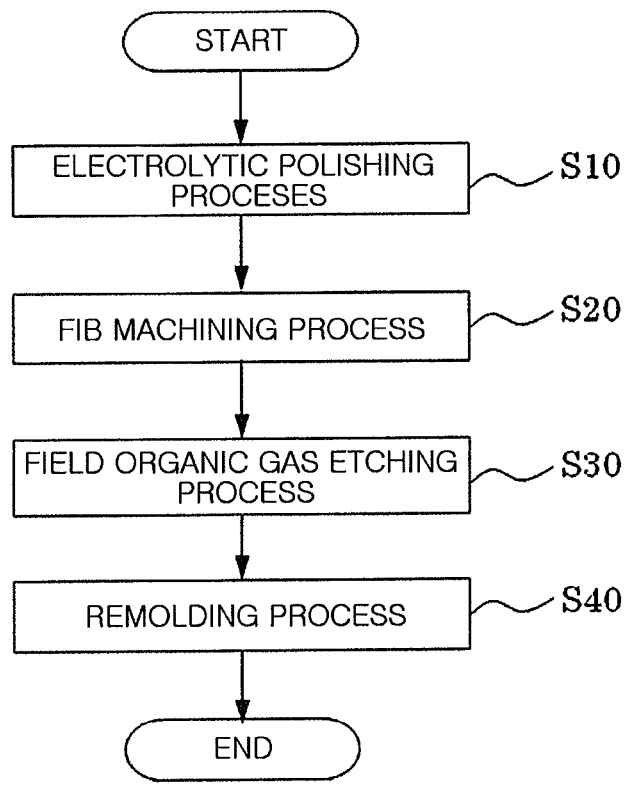
FIG. 8 is a flowchart illustrating a method of manufacturing an iridium tip according to an embodiment of the present invention.

The method of manufacturing an iridium tip, as shown in FIG. 8, includes an electrolytic polishing process (a step S10), an FIB machining process (a step S20), an field organic gas etching process (a step S30), and a remolding process (a step S40), which are sequentially performed. The processes are described hereafter.

In the step S10 (electrolytic polishing process), a tip member that is a thin wire made of monocrystal iridium in a circular rod shape having predetermined dimensions (for example, a diameter of 0.15 mm and a length of 8 mm) and has a longitudinal direction arranged in a <210> orientation is used as a raw material for an iridium tip to be sharpened. The shapes (fourth shape or fifth shape) of the Embodiment 1 may be used. Further, for example, an iridium tip is made by sharpening a circular rod-shaped tip member through electrolytic polishing until the free end diameter of a conical shape becomes a predetermined value (for example, between hundreds of nanometers and several micrometers).

In detail, electrolytic polishing is performed, for example, by dipping an iridium tip member and a platinum opposite electrode into a potassium hydroxide 1 mol/L and then applying AC power to the gap of them (that is, in between the tip member 14 and the opposite electrode). The AC current is set, for example, at about 30V(rms) and a frequency of 60 Hz. The free end of the tip member is formed into a conical shape of which the free end diameter is hundreds of nanometers to several micrometers by the electrolytic polishing process. Further, impurities such as an electrolytic solution from the iridium tip by cleansing the iridium tip with water and acetone after the electrolytic polishing.

The step S20 (FIB etching process) is a process of reducing the free end diameter of the iridium tip in the range of tens of nanometers to hundreds of nanometers. After the electrolytic polishing process of the step S10, the free end diameter is made be tens of nanometers to hundreds of nanometers by applying FIB etching to the iridium tip using a gallium FIB (Ga-FIB) apparatus (not shown). The open angle (entire angle) of the free end of the tip is machined to 5° or more and less than 15° by the step S20. When the open angle of the free end of the tip is less than 5°, the free end is easily deformed, so it is preferable that the open angle is 5° or more. Further, when the open angle of the free end of the tip is 15° or more, the extraction voltage increases, so it is preferable that the open angle is 5° or more and less than 15°. More preferably, the open angle may be 8° to 12°. Further, more preferably, the open angle is 9° to 11°.

The step S30 (field organic gas etching process) and the step S40 (remolding process) after the step S20 are processes of further sharpening the free end of the iridium tip that has undergone the step S20. The steps S20 and S30 are both performed by a tip manufacturing apparatus (not shown).

The tip manufacturing apparatus includes at least: a gas field ion source; a gas supplier that supplies ionized gas; a vacuum container that is disposed opposite to the gas field ion source and keeps a fluorescent screen for visualizing atomic arrangement at the free end of a tip using emitted ions; an image detector that takes an image of a fluorescent image on the fluorescent screen, such as a camera; a power that applies power to the gas field ion source or the image detector; a calculation processor that controls the power and receives an image signal; and an exhaust unit that excavates the vacuum container.

In the tip manufacturing apparatus, first, a gas field ion source equipped with an iridium tip that has undergone the step S20 is installed and then the vacuum container is excavated. The internal pressure of the vacuum container is adjusted to base pressure (for example, $2 \times 10^{-8}$ Pa) or cooling temperature of the iridium tip is adjusted to predetermined temperature (for example, 60K). Helium is supplied into the vacuum container from the gas supplier until the internal pressure of the container becomes, for example, $1 \times 10^{-4}$ Pa. The calculation processor controls the power to apply voltage to the iridium tip. When the voltage (tip voltage) applied to the iridium tip reaches for example 4 kV, an FIM pattern (FIM image) of helium shows up on the fluorescent screen, and then the FIM pattern is taken by the camera and kept in the calculation processor.

When the iridium tip has undergone the step S20 or is damaged at the free end, a large amount of impurities are adsorbed on the free end of the iridium tip, so a pattern without crystallinity is obtained. When the tip voltage is gradually increased and the field intensity at the free end of the tip becomes higher than the field evaporation intensity of iridium, field evaporation of the iridium atoms starts. When field evaporation of some atomic layers at the free end of the iridium tip occurs, a pure surface with crystallinity of iridium is exposed. In this case, the tip voltage increases, for example, 5 kV to 6 kV. If the tip voltage decreases, for example, by about 1 kV, it is the optimal voltage (best imaging voltage) where an image is obtained by helium, so an FIM pattern with regular atomic arrangement appears. A crystalline defect (absence of an atom or deviation of atomic arrangement etc.) is observed from a pure surface in some cases. When there is no defect, the process moves to the step S30, or skips the step S30 and moves to the step S40 (remolding process). When there is a crystalline defect in the atomic arrangement on the surface of the free end of the tip, a desired pyramidal structure cannot be obtained in the step S40. In this case, the free end of the tip is cut (atoms are removed) by combining field organic gas etching and field evaporation into the areas without a crystalline defect. Whether to move to the step S40 is determined by observing the pure surface.

Next, nitrogen or oxygen is supplied, as etching gas, around the iridium tip from the gas supplier such that the internal pressure of the vacuum container becomes $1 \times 10^{-4}$ Pa to $1 \times 10^{-3}$ Pa, by setting extraction voltage 0.5 kV lower than the maximum voltage by the field evaporation (for example, about 4.5 kV to 5.5 kV).

In this case, the extraction voltage and the area to be etched of the iridium tip have a predetermined relationship. That is, if the extraction voltage is low, the free end area of the iridium tip where an electric field is strong is etched, but if the extraction voltage is high, the area except for the free end area of the iridium tip (for example, the lower portion) is etched. Accordingly, in the process of the present invention, the area except for the free end area of the iridium tip is etched by setting extraction voltage high enough for field ionization of helium. Accordingly, it is possible to reduce the iridium atoms moving to the step S40, the remolding process, described below, so it is possible to decrease the time for the remolding process. Further, since the free end of the iridium tip is thin and sharpened, it is possible to prevent a pyramidal structure from growing at undesired positions in the remolding process. When the field organic gas etching is performed, the free end becomes thin and sharpened, so the extraction voltage is decreased to prevent field evaporation of the atoms at the free end.

When the free end is thin and sharpened at a desired level, supply of etching gas by the gas supplier is stopped and the remaining gas is evacuated, with the extraction voltage continuing to be applied. In this case, the best imaging voltage of helium is about 3.6 kV. Thereafter, the extraction voltage is reduced to obtain field intensity for field ionization of nitrogen. It is possible to prevent the free end area of the iridium tip from being etched by sufficiently evacuating, or it is possible to suppress etching of the free end area of the iridium tip by quickly decreasing the extraction voltage.

When there is a crystalline defect at the free end of the iridium tip, the extraction voltage is controlled to etch the free end area of the iridium tip until the crystalline defect is removed. Accordingly, even if there is a crystalline defect at the free end of the iridium tip, the crystalline defect is removed by etching.

Next, a nano-pyramidal structure is formed at the free end of the iridium tip using the tip manufacturing apparatus in the step S40.

For example, the extraction voltage is reduced to about ⅓ of the optimal voltage by helium, that is, to about 1.2 kV. This voltage is almost the same of the nitrogen imaging voltage. Further, the internal pressure of the vacuum container is adjusted, for example to $1 \times 10^{-3}$ Pa by supplying nitrogen gas into the vacuum container. The extraction voltage is finely adjusted to be able to observe FIM pattern of nitrogen. The remolding process of this embodiment is described hereafter. Remolding is performed in a nitrogen atmosphere, unlike remolding in the related art. Further, according to the remolding of the related art, tip voltage is increased by applying heat with the current of a filament of a tip assembly maintained, and then the free end of a tip is sharpened by decreasing the current of the filament, but according to this embodiment, sharpening is performed in the following order.

First, an iridium tip is heated by supplying current of, for example, 3.5 A for to a filament three minutes with extraction voltage applied. When the heating is finished, an FIM pattern of nitrogen is photographed and observed by a camera.

If there is little change in the FIM pattern of nitrogen photographed and observed, it is heated by increasing the current, for example, by 0.1 A step by step.

When the current of the filament becomes, for example, 3.9 A, the FIM pattern starts changing. That is, in the facets shown in FIG. 4, the {111} facet widens and the {110} facet decreases. Further, the {100} facet widens and the {311} facet decreases. The larger change of the facet as above, the more the free end of the iridium tip is sharpened, so the tip voltage where the FIM pattern of nitrogen is photographed and observed by the camera (that is, tip voltage where the FIM pattern of nitrogen shows up) drops, for example, hundreds of voltages. The tip voltage where the FIM pattern of nitrogen shows up is substantially about 0.9 kV.

When the voltage where the FIM pattern of nitrogen appears decreases, the current of the filament is fixed, for example, at 3.9 A and the tip voltage for heating is set at 20% to 180% of the extraction voltage where the FIM pattern of nitrogen appears. In most cases, it is decreased. Further, the tip voltage for heating is not limited to decreasing under the tip voltage where the FIM pattern appears, and it may be increased over the extraction voltage where the FIM pattern of nitrogen appears, for example, in accordance with a change in crystal of the free end of the iridium tip obtained from the FIM pattern of nitrogen.

For example, if heating is performed repeatedly with tip voltage of 0.5 kV and filament current of 3.9 A, several spot patterns are photographed and observed by a camera.

Finally, only one spot point remains, so the free end of the iridium tip is composed of only one atom.

When the extraction voltage is increased over the level where the FIM pattern of nitrogen shows up, the ridge between two {111} facets may be a double line and the {111} facets may not grow in remolding at 80% of the extraction voltage in some cases, and when the extraction voltage is gradually increased up to 120%, the {111} facets increase and only one ridge may be made in some cases.

In the step S40, it may be possible to manufacture an iridium tip using oxygen gas instead of nitrogen gas. That is, oxygen gas instead of nitrogen gas is supplied into the vacuum container from the gas supplier, tip voltage where the FIM pattern of nitrogen is set, and then the iridium tip is heated.

Next, the supply of the oxygen gas is stopped, nitrogen gas is supplied, and the tip voltage where the FIM pattern on nitrogen is checked. At this voltage, the iridium tip is heated by stopping the supply of the nitrogen gas and supplying oxygen gas. This process is repeated. In this case, the heating temperature is gradually increased.

For example, when the atoms at the free end of the iridium tip starting moving is detected from the FIM pattern of nitrogen, the extraction voltage is set at 20% to 180% of the extraction voltage where the FIM pattern of nitrogen shows up, oxygen gas is supplied, and the iridium tip is heated. In most cases, the extraction voltage is decreased. Further, the tip voltage for heating is not limited to decreasing under the tip voltage where the FIM pattern shows up, and it may be increased over the tip voltage where the FIM pattern of nitrogen shows up, for example, in accordance with a change in crystal of the free end of the iridium tip obtained from the FIM pattern of nitrogen.

Finally, only one spot point remains, so the free end of the iridium tip is composed of only one atom.

Helium may be used instead of oxygen.

Through the process from the step S10 to the step S40, it is possible to manufacture an iridium tip having the pyramidal structure that has a free end (apex) composed of one atom in the <210> orientation surrounded by one {100} facet and two {111} facets, as shown in FIGS. 7A and 7B.

When the iridium tip is used for a gas field ion source described below, the field organic gas etching process of the step S30 and the remolding process of the step S40 may be performed in the gas field ion source emitting ion beams. Accordingly, there is no need for taking the iridium tip out of the gas field ion source and impurities that stick to the iridium tip if the iridium tip is moved can be prevented, so the work efficiency can be improved.

Further, the iridium tip of this embodiment has a structure formed by sharpening the free end of a tip member made of monocrystal iridium at the atomic level, but it is not limited thereto, and the iridium tip may be coated with a thin iridium film by plating.

(Embodiment 3) Gas Field Ion Source

As an example of using the iridium tip 5 in Embodiment 1, a gas field ion source is described.

The iridium tip 5 of this embodiment is made of iridium and has a pyramidal structure having a free end composed of one iridium atom in the <210> orientation surrounded by one {100} facet and two {111} facets, at a sharpened monocrystalline free end portion in the <210> orientation. The facets and pyramidal structure can be observed by observing an FIM image in advance.

The gas supplied into an ion source chamber 84 from an ion source gas supplier 95, that is, the raw gas for forming an FIB may be rare gas such as helium, neon, argon, krypton, and xenon, or may be molecular gas such as hydrogen, oxygen, and nitrogen. Further, mixtures of these gases may be used.

In this embodiment, nitrogen gas is used as the ion source gas. Although a tungsten tip is used in a common gas field ion source of the related art, nitrogen gas corrodes (etches) tungsten, so there is no case of actively discharging nitrogen ions using gas mainly containing nitrogen. On the contrary, nitrogen is prevented from remaining in the ion source chamber 84 and is also prevented from coming into the gas supplied from the ion source gas supplier 95, so nitrogen gas cannot be used. Further, rare gas such as helium is mainly used and, at most, a very small amount of nitrogen gas is added to shape the free end of a tip.

According to the iridium tip of this embodiment, the atom at the free end of the iridium tip maintained without separating after a long period of time, so ions can be stably emitted for a long period of time. Further, the atomic arrangement in each conical surface of the pyramidal structure at the free end of the iridium tip 5 is dense, so impurity particles around the iridium tip have difficulty in sticking to the iridium tip. Accordingly, an FIB with a very small current change or radiation position change can be achieved, so a high-performance FIB apparatus can be provided. Therefore, the number of remaking processes for returning the free end of the iridium tip 5 to have one atom is considerably decreased, so it is possible to reduce the time for repairing the apparatus and to largely decrease the burden on the user.

(Embodiment 4) Focused Ion Beam Apparatus

This embodiment relates to a focused ion beam (FIB) apparatus equipped with a gas field ion source. The FIB apparatus is also called a scanning ion microscope (SIM), but an apparatus for machining (for example, boring, cutting, and depositing) and observing a sample is also called an FIB apparatus, and an apparatus only for observing the shape of a sample is called the scanning ion microscope. Accordingly, ions that can actively sputter a sample is used in an FIB apparatus, but light element ions such as helium having small mass and having difficulty in sputtering a sample is used in a scanning ion microscope. However, both of the apparatuses require the ability of focusing ion beams and of stably emitting ion beams for a long period of time.

FIG. 9 shows a schematic configuration of an FIB apparatus 80. The FIB apparatus 80 largely includes an ion beam barrel 81, a sample chamber 82, and a controller 83.

The ion beam barrel 81, at least, includes a ion source chamber 82 having an iridium tip 5 generating ions, a condenser lens electrode 86 focusing ions from the ion source chamber 84 to the FIB 85, and an objective lens 88 focusing the FIB 85 to a sample 87.

Further, the ion beam barrel 81 has an intermediate chamber 89 between the ion source chamber 84 and the intermediate chamber 89, and orifices 90 and 91 between the ion source chamber 84 and the intermediate chamber 89 and between the sample chamber 82 and the intermediate chamber 89. The FIB 85 is radiated to the sample 87 through the orifices 90 and 91. Accordingly, it is possible to enlarge very small parts of the sample, so the focused ion beam apparatus is also called an ion microscope.

The intermediate chamber 89 is connected to a vacuum pump 92, so the vacuum degree of the intermediate chamber 89 can be adjusted by the vacuum pump 92. Further, the intermediate chamber 89 an be differentially excavated between the sample chamber 82 and the ion source chamber 84.

The ion source chamber 84 has the gas field ion source 93 having the iridium tip 5 and emitting the FIB 85 and an extraction electrode 94 forming an electric field for extracting the FIB 85 around the iridium tip 5.

The iridium tip 5 is made of monocrystal of iridium. The iridium tip has any one of the tip shapes described in Embodiment 1. Further, the iridium tip 5 may be formed by coating a needle-shaped base material made of monocrystal of iridium with iridium by electric plating or depositing. The iridium tip 5 has the pyramidal shape, which is described in Embodiment 3, at the free end.

A heater 95 is connected to the iridium tip 5. The heater 95 can control temperature of the iridium tip 5 and used for cleansing the surface of the iridium tip 5 and manufacturing a pyramidal structure at the free end of the iridium tip 5.

Further, a cooling unit 96 for cooling the iridium tip 5, an ion source gas supplier 97 for supplying an ion source gas into the ion source chamber 84, and a vacuum pump 98 for evacuating the ion source chamber 84 are connected to the ion source chamber 84.

The cooling unit 96 cools the iridium tip 5 or the ion source gas supplied to the ion source chamber 84 from the ion source gas supplier 97, using a refrigerant such as liquid helium or liquid nitrogen. For example, the cooling unit 96 cools the iridium tip 5 and the ion source gas through a connector 99 for connecting the ion source chamber 84 and through the wall 100 of the ion source chamber 84.

The cooling unit is not limited to this configuration, and at least has only to cool the iridium tip 5, and for example, may have a cooling block or a cooler. A cold head for dissipating heat from the iridium tip 5 is disposed between the ion source chamber and the tip assembly. The cold head is made of alumina or sapphire, or ceramics such as aluminum nitride in the shape of a block, and is fixed to a base.

The ion source gas supplied from the ion source gas supplier 95 may be rare gas such as helium, neon, argon, krypton, and xenon, or may be molecular gas such as hydrogen, oxygen, and nitrogen. The ion source gas is discharged into ions from the free end of the iridium tip 5, but influence by chromatic aberration is small because the energy width of the FIB 85 is very small. The gas field ion source 93 of this embodiment is an ion source having a very small ion generation area and high luminance, as compared with a plasma gas ion source or a liquid metal ion source known in the art. In this embodiment, the ion source gas is nitrogen. Nitrogen makes field ionization at relatively low field intensity (for example, 17V/m), but contaminants adsorbed to the iridium tip 5 are separated at lower field intensity, so the surface of the iridium tip 5 is clean without contaminants when nitrogen is ionized.

Unless an electric field is stronger than that for nitrogen, hydrogen (about 22V/nm of field intensity of field ionization), helium (about 44V/nm of field intensity of field ionization), neon (about 35V/nm of field intensity of field ionization), and argon (about 22V/nm of field intensity of field ionization) are not ionized. Accordingly, even if those gases remain in the ion source chamber 84, they are not ionized, so the purity of the nitrogen supplied from the ion source gas supplier 95 does not need to be specifically high. Accordingly, it is possible to reduce the cost for operating the apparatus.

Nitrogen gas corrodes some metals, so a tungsten tip is corroded (etched) although a very small amount of nitrogen is included in helium in the gas field ion source using a tungsten tip of the related art, so the tip shape is changed and the free end of the tip for emitting ions is damaged. Accordingly, in the gas field ion source using a tungsten tip of the related art, even if nitrogen gas is supplied as a main component, a nitrogen ion beam may not be produced.

Further, the gas handled by the ion source gas supplier 95 is not limited to one kind, and a gas bombe (not shown) for various kinds of gases may be installed to change gases or mix gases and supply them to the ion source chamber 84, if necessary.

Temperature control on the iridium tip 5 is described hereafter.

When the temperature of the iridium tip 5 is low, the adsorption density of gas molecules increases. Accordingly, it is possible to increase the amount of current of the FIB 85 by reducing the temperature of the iridium tip 5. However, depending on the kinds of gases or the cooling temperature, when the temperature of the iridium tip 5 is decreased, gas molecules are adsorbed and solidified on the wall 100 of the ion source chamber 84 or the connector 99 between the cooling unit 96 and the ion source chamber 84. The solidified gas molecules are simultaneously evaporated when the temperature of the ion source chamber 84 is increased, so the partial gas pressure of the ion source chamber 84 rapidly increases, so the gas field ion source unstably operates or is discharged, and accordingly, the free end of the tip may be damaged.

The cooling temperature of the iridium tip 5 is different in accordance with the kinds of ion source gases supplied from the ion gas supplier 95 by a temperature controller 101, but the temperature can be set between about 40K and 200K in this embodiment. Accordingly, it is possible to stably ion beam of a current amount for fine machining.

The FIB of gas ions allows for observing a sample surface by secondary electrons produced at the radiated portion (not shown) of the sample 87 and allows for machining a sample surface by sputtering by ions radiated to the sample 87 (for example, boring and removing a surface layer).

The ion source gas supplier 97 has a gas tank (not shown) for keeping the ion source gas, a nozzle 96a for supplying the ion source gas around the iridium tip 5, and a valve 96b having high precision between the nozzle 96a and the ion source gas supplier 97, so it can actively adjust a flow rate and supply the ion source gas to the free end of the iridium tip 5.

Further, the ion beam barrel 81 has a detector (not shown) for obtaining an FIM (field ion microscope) image for checking the atomic arrangement at the free end of the iridium tip 5 of the gas field ion source 93. The detector can move in the barrel, and when there is no need for checking an FIM image, the detector may be stowed away from the ion beam axis. The detector can check the atomic arrangement at the free end of the iridium tip 5, if necessary, for example, when the ion current is unstable or the observed is distorted.

The sample chamber 82 has a sample stage 102 for moving the sample 87 to the position where the FIB 85 is radiated from the ion beam barrel 81. The sample stage 102 operates in response to instructions from an operator and can move with respect to five axes. That is, the sample stage 102 includes an actuating mechanism has an XYZ-axial mechanism (not shown) for moving the sample stage 102 along X and Y axes perpendicular to each other in the same plane and a Z axis perpendicular to these axes, a tilt-axial mechanism (not shown) for rotating and tilting the sample stage 102 about the X axis or the Y axis, and a rotating mechanism (not shown) for rotating the sample stage 102 about the Z axis.

A detector 103 that detects secondary ions or secondary electrons produced by scanning radiation of the FIB 85 is disposed in the sample chamber 82. Accordingly, an observation image can be created on the basis of a detection signal of the secondary ions or the secondary electrons and a scanning signal of the FIB 85. When the detector 103 is a reflective ion detector, it is possible to produce a reflective ion image by detecting reflective ions from the sample 87.

Further, a gas supplier 104 that can spray gas to the sample 87 while the FIB 85 is radiated is disposed in the sample chamber 82. The gas supplier 104 has a gas tank (not shown) for keeping gas and a nozzle 104a for spraying the gas to the sample 87. The gas supplier 104 may have a gas flow rate controller (not shown) such as mass flow controller that controls the flow rate of gas. It is possible to form a deposition film on the sample surface by radiating the FIB 85 and spraying deposition gas such as carbon-based gas or carbon-based composite gas (organic composite gas) including metal such as platina or tungsten to the radiated portion (not shown) of the sample 87 from the gas supplier 104. In contrast, it is possible to selectively remove contaminants on the sample surface or perform machining more quickly than sputtering by radiating the FIB and spraying halogen-based etching gas such as iodine from the gas supplier 104.

Further, a vacuum pump 105 that can adjust the vacuum degree in the sample chamber 82 is connected to the sample chamber 82.

The controller 83 includes an image forming unit 106, an extraction voltage control unit 107, an ion source gas control unit 108, and a temperature control unit 101. The controller 83 can control the voltage applied to a condenser lens electrode (not shown) and an objective lens electrode (not shown) and movement of the sample stage 102.

The image forming unit 106 creates an observation image on the basis of a detection signal from the detector 103 and displays the observation image on a display unit 109. Accordingly, as the FIB 85 is radiated to the sample 87 and the detector 103 detects the secondary ions or the secondary electrons, the observation image of the sample 87 can be displayed on the display unit to be visible. Further, as the detector 103 detects the secondary electrons, it is possible to check the shape of the sample surface, and as the detector 103 detects the secondary ions, it is possible to check distribution of the elements in the sample.

The extraction voltage control unit 107 controls the voltage applied to the extraction electrode 94. The extraction voltage control unit 107 is used when the current of emitted ions is adjusted or when the pyramidal structure at the free end of the iridium tip 5 is manufactured or processed.

The ion source gas control unit 108 controls the ion source gas supplier 97 having the gas flow rate controller (not shown) such as a mass flow controller for adjusting the flow rate of the ion source gas.

The temperature controller 101 can control the cooling unit 96 that cools the iridium tip 5 or the ion source gas and the heater 85 used for heating and cleansing the iridium tip 5.

A focused nitrogen ion beam, for example, a nitrogen ion beam having a diameter of 1 nm or less, can be produced by the FIB apparatus 80. The stability of the focused nitrogen ion beam is high, for example, 1%/hour or less, and for example, it can continuously operate for about 30 days without the atom at the free end of the iridium tip 5 separating, thus continuously emitting ions. Further, the ion generation position is not changed and it was found by the inventor(s) that focused ion beams were continuously generated. Accordingly, the lifespan is much longer than the continuous operation of about 2250 seconds (at most 40 minutes) disclosed in Non-Patent Document 1. Accordingly, it is possible to achieve high resolution and visualize the sample surface of the element distribution, so it is possible to increase the lifespan and the stability of the FIB apparatus 80. In the common FIB apparatus using a gas field ion source of the related art, helium ions are used, so a sample surface cannot be machined due because the ions being too light. On the contrary, according to the FIB apparatus 80 using nitrogen gas of this embodiment, it is possible to machine a sample surface, and it is also possible to machine very small local areas due to the focusing ability, as compared with the common gallium FIB apparatus.

Although the FIB apparatus 80 was described in Embodiment 4, it may be possible to manufacture a composite apparatus (ion-electrode composite beam apparatus) by mounting the barrel of a scanning electron microscope on the FIB apparatus 80 so that the FIB 85 and an electron beam are radiated to an almost same position on a sample surface.

Further, it is possible to identify the elements of a radiating unit by mounting a secondary ion detector on the sample chamber 82 of the FIB apparatus 80 and analyzing secondary ions produced from the radiated portion of a sample. For example, it is possible to make a map of a specific element by radiating an FIB to a predetermined area and analyzing elements. In particular, it is possible to analyze elements with high response for fine areas, using an oxygen FIB. On the other hand, in analysis of secondary ions using the gallium FIB apparatus of the related art, even gallium typed in a sample is detected, so it is impossible to discriminate the gallium from the gallium originally included in the sample, but this embodiment does not have this problem. Further, since the FIB apparatus 80 of this embodiment can focus beams better than the gallium FIB apparatus of the related art, it is possible to analyze elements in fine areas.

Further, since the FIB apparatus 80 can be used as an apparatus for correcting a photomask which is used for manufacturing a semiconductor, it is possible to remove defects on a complicated and fine mask corresponding to a ultra-fine semiconductor pattern that is recently used, and to add a pattern using a deposition function.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A focused ion beam apparatus at least equipped with a gas field ion source having an emitter for emitting ions, wherein the emitter has a shape in which a sharpened end part made of iridium is fixed to a cylinder shape base part made of dissimilar wire.

2. The focused ion beam apparatus as set forth in claim 1, wherein the dissimilar metal wire is made of any one of tungsten, molybdenum, tantalum, and niobium.

3. The focused ion beam apparatus as set forth in claim 2, wherein the sharpened end part has a pyramidal structure of which an apex is composed of one iridium atom in a <210> orientation surrounded by one {100} facet and two {111} facets, at a sharpened free end.

4. The focused ion beam apparatus as set forth in claim 1, wherein the sharpened end part has a pyramidal structure of which an apex is composed of one iridium atom in a <210> orientation surrounded by one {100} facet and two {111} facets, at a sharpened free end.

5. In a focused on beam apparatus: a gas field ion source having an emitter configured to emit ions, the emitter having a sharpened end part made of iridium fixed to a cylinder-shaped base part that is not made of iridium.

6. The focused beam apparatus according to claim 5; wherein the sharpened end part is coaxially aligned with the cylinder-shaped base part.

7. The focused beam apparatus according to claim 6; wherein the emitter includes a ring encircling both the sharpened end part and the cylinder-shaped base part in the region where the two parts are fixed to one another.

8. The focused beam apparatus according to claim 5; wherein the sharpened end part and the cylinder-shaped base part have matching recesses fixed to one another to fix the two parts together.

9. The focused ion beam apparatus as set forth in claim 5, wherein the sharpened end part has a pyramidal structure of which an apex is composed of one iridium atom in a <210> orientation surrounded by one {100} facet and two {111} facets, at a sharpened free end.

10. The focused ion beam apparatus according to claim 5; wherein the cylinder-shaped base part is made of any one of tungsten, molybdenum, tantalum and niobium.

11. The focused ion beam apparatus according to claim 10; wherein the cylinder-shaped base part is made of any one of tungsten, molybdenum, tantalum and niobium.

* * * * *